United States Patent [19]

Hankins

[11] 4,454,002

[45] Jun. 12, 1984

[54] CONTROLLED THERMAL-OXIDATION THINNING OF POLYCRYSTALLINE SILICON

[75] Inventor: Kevin T. Hankins, Palm Bay, Fla.

[73] Assignee: Harris Corporation, Melbourne, Fla.

[21] Appl. No.: 533,584

[22] Filed: Sep. 19, 1983

[51] Int. Cl.³ .................. H01L 21/306; B44C 1/22; C03C 15/00; C03C 25/06

[52] U.S. Cl. .................. 156/626; 156/653; 156/657; 156/659.1; 156/662; 427/93

[58] Field of Search .......... 427/86, 93; 156/626, 156/653, 657, 659.1, 662, 643, 628; 430/313, 317, 329

[56] References Cited

U.S. PATENT DOCUMENTS

| | | |
|---|---|---|
| 3,699,395 | 10/1972 | Boleky . |
| 3,699,403 | 10/1972 | Boleky . |
| 3,792,319 | 2/1974 | Tsang . |
| 4,053,349 | 10/1977 | Simko .................. 156/628 |
| 4,176,003 | 11/1979 | Brower et al. .......... 427/93 X |
| 4,219,379 | 8/1980 | Athanas ................ 427/93 X |
| 4,285,761 | 8/1981 | Fatula et al. ............ 156/628 |
| 4,377,605 | 3/1983 | Yamamoto ................ 427/93 |

Primary Examiner—William A. Powell
Attorney, Agent, or Firm—Barnes & Thornburg

[57] ABSTRACT

A polycrystalline silicon fuse is formed to have a thickness below 1000 Angstroms by depositing a polycrystalline silicon layer to a thickness greater than 1200 Angstroms, oxidizing the polycrystalline silicon in a partially rich oxygen atmosphere to under 1000 Angstroms, removing the oxide layer over at least a sample fuse and measuring the thickness of the polycrystalline silicon.

9 Claims, 6 Drawing Figures

CONTROLLED THERMAL-OXIDATION THINNING OF POLYCRYSTALLINE SILICON

BACKGROUND AND SUMMARY OF THE INVENTION

The present invention relates generally to polycrystalline silicon and more specifically to a method of fabricating thin polycrystalline silicon fuses.

Generally, two materials have been used to form fuses in integrated circuits. These materials are generally nichrome and polycrystalline silicon. The method of control of nichrome thickness is a control crystal in the deposition machine. The frequency of the crystal lowers with increased nichrome thickness. The method of control of polycrystalline fuse thickness has been to use an intensity-versus-wavelength thickness measurement tool to measure the thickness of the polycrystalline layer over a controlled oxide on a product or pilot wafer after deposition. In addition, thicknesses can be measured on a calibrated S.E.M. or the film patterned and then measured on a stylus having calibrated amplified wafer-normal displacements.

For certain integrated circuits, for example, metal oxide insulated gate field effect transistors, nichrome and other similar type of materials have not been considered compatible with processing techniques. For these integrated circuits, the polycrystalline silicon fuse is preferred.

In bipolar as well as insulated gate field effect transistor circuits, the current limiting impedance in the fuse path as well as the characteristics of the fuse itself set how much power can be delivered to the fuse during fusing. Because of the circuit layouts, some integrated circuits have a significant number of hard-to-program fuses. To resolve this problem, the fuse has to see more power. Instead of redesigning the circuit to match the fuse characteristics, it is preferable to redesign the fuse to match the circuit limitations. Tests have indicated that the narrower and the thinner the fuse, the better the fuse programmability. To design fuses which will program reliably, the thickness of the polycrystalline layer must be less than 1000 Angstroms. Realizing that polycrystalline cannot be deposited uniformly without pinholes and other undesirable structural defects below 1200 Angstroms, a method of thinning polycrystalline material controlably must be found.

An object of the present invention is to provide a method of fabricating thin film polycrystalline fuses of high reliability.

Another object of the present invention is to provide a method of fabricating specific resistance polycrystalline fuses of approximately 400 to 1000 ohm resistance.

Still another object of the present invention is to provide a method of fabricating thin film, low resistance polycrystalline fuses with very high probability of programming with a limited number of pulses programming algorithm.

These and other objects of the invention are attained by depositing a layer of polycrystalline silicon at a controlled thickness of greater than 1200 Angstroms, oxidizing the polycrystalline layer to form a polycrystalline layer of a thickness below 1000 Angstroms with an oxide layer thereon, removing oxide over sample fuses and measuring the thickness of the polycrystalline layer. The final desired thickness is below 950 Angstroms. This method assures uniform thin layers of polycrystalline material to accurate thicknesses which results in desired resistances. The polycrystalline layer is oxidized in a partial oxygen rich environment, for example, steam or oxygen wherein the oxygen rich environment represents less than 50% of the total environment. The polycrystalline layer may be doped with impurities to lower its resistance. Similarly, the polycrystalline layer may be patterned to the fuse geometry before or after the oxidation step.

The formation of oxide layers on polycrystalline material is well known in the prior art. As described in U.S. Pat. No. 3,792,319 to Tsang, the polycrystalline layer is partially oxidized to form a thick mask layer to be used for patterning the polycrystalline layer. Although the polycrystalline layer is thinned as a byproduct of this operation, the importance of the step is the thickness of the oxide layer such that it can operate as a mask layer. Thus, this process is optimized for the oxide layer and not the resulting polycrystalline layer. The prior art shows other examples of partially or fully oxidizing a polycrystalline layer to produce a desired oxide thickness for a specific purpose. Prior to the present invention, the prior art failed to control the oxidation process to produce a desired thickness of polycrystalline layer.

Other objects, advantages and novel features of the present invention will become apparent from the following detailed description of the invention when considered in conjunction with the accompanying drawings.

DETAILED DESCRIPTION OF THE DRAWINGS

Figure 1:
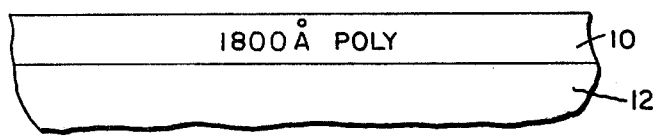
FIGS. 1 through 6 show cross-sections of a polycrystalline material during different stages of processing incorporating the principles of the present invention.

A polycrystalline silicon layer 10 is deposited on a substrate 12 to a thickness greater than 1200 Angstroms as illustrated in FIG. 1. By way of example, the present process will be described to form a 625 ohm fuse having a neck within the range of 1 to 2 microns. For this product and the example process to be described, the polycrystalline layer 10 is deposited to a target thickness of 1800 Angstroms ±100 Angstroms. The substrate 12 may be a silicon substrate or a layer of oxide preferably having a thickness of greater than 4000 Angstroms. The polycrystalline silicon layer 10 is deposited by low pressure chemical vapor deposition. By way of example, the pressure will be 600 millitorr at a temperature in the range of 600 to 640 centigrade using $SiH_4$ for approximately 20 minutes.

Figure 2:
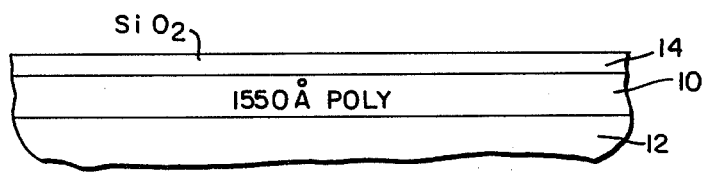

Next, the polycrystalline layer 10 has impurities introduced therein to lower its resistance. For example, it may be doped with phosphorous using a $POCl_3$ environment at, for example, 950 degrees centigrade for 10 minutes. The $POCl_3$ in combination with oxygen and nitrogen results in a polycrystal layer having a sheet resistance of 45±5 ohms per square with a silicon dioxide layer 14 formed thereon as illustrated in FIG. 2. This reduces the depth thickness of the polycrystalline layer to 1550 Angstroms ±50 Angstroms. It should be noted that the doping step may be omitted if desired and consequently the effect of this oxidation step must be either included or excluded depending upon whether doping is performed in the determination of the final oxide thinning step.

Figure 3:
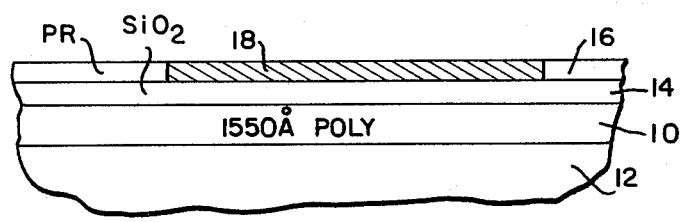
Figure 4:
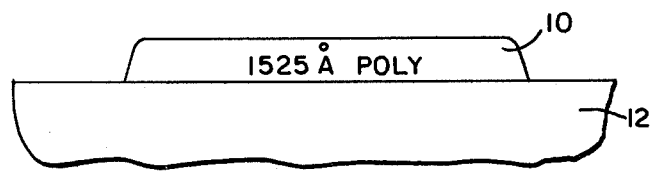

A layer of photoresist 16 is applied on the polycrystalline layer 10 separated by the oxide layer 14 and patterned as indicated by the section 18 in FIG. 3 to define the geometry of the fuse. As indicated above, the fuse is designed to have a fuse neck within the range of 1 to 2 microns and a length of 2.4 to 4 microns. It should be noted that the fuse geometry may be patterned without a neck for permanent fuses which are not to be programmed or may have a geometry of an open fuse during this step. The photoresist 16 may be a positive or negative photoresist with a resulting etching to define the geometry as illustrated in FIG. 4.

Figure 5:
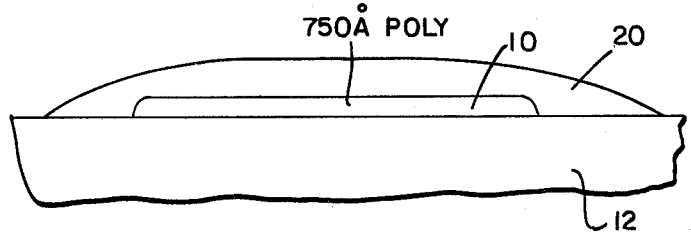

The next and most important step is the oxidation of the polycrystalline silicon layer 10 to within the final desired thickness of the polycrystalline silicon thickness for the desired fuse resistance. The thickness of layer 10 is measured sometime before the present step. This measurement may be taken at the original deposition of FIG. 1 or at any other point along the processing stage including that of FIG. 4. Based on the past history between the time of measurement and the present oxidation cycle, the time, gas flow, temperature and pressure are chosen such that the amount of oxidation consumes the desired amount of polycrystalline material necessary to arrive at the desired film thickness. The oxygen cycle is either a diluted steam or diluted oxygen which consumes the polycrystal. This diluted atmosphere allows a slow controlled oxidation such that the final resulting thickness of the polycrystalline layer 10 is within a very tight tolerance. By way of example, the environment may be a 30% steam in $N_2$ at approximately 850° C. For the example described, the controlled thinning of the polycrystalline silicon has a thickness of approximately 750 Angstroms ±100 Angstroms. The resulting structure with the silicon dioxide film layer 20 thereon is illustrated in FIG. 5.

Figure 6:
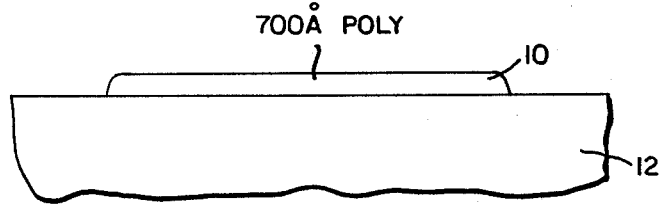

Following the oxidation, the oxide is removed by the dry aperture etch which is used to form the MOS source, drain and gate contacts. This will remove about 50 Angstroms of the polycrystalline silicon fuse and results in the final thin fuse layer of 700 Angstroms ±100 Angstroms. The final structure is illustrated in FIG. 6. As part of an overall process and integrated circuit, other processes may be performed and other layers produced on the polycrystalline fuse. The oxide removal step may be important for circuits with limited power, and must be performed late in the process such that the neck part of the fuse is exposed for thermal considerations.

The final thickness of the exposed polycrystalline layer is measured to assure that the process parameters are proper. In production, sample fuses are formed and the measurement is performed only after oxidation and removal of oxide from at least the sample fuse. The pre-oxidation measurement is eliminated.

The present process has been performed in a production environment resulting in a fuse thickness mean of 632 Angstroms with a one sigma deviation of 76 Angstroms. It is believed that the one sigma deviation is less if one takes into account the measurement tool deviation. Thus, it can be seen that the present process produces a uniform reliable fuse within a very close tolerance of thickness below the thickness which can be achieved by mere deposition.

From the preceding description of the preferred embodiment, it is evident that the objects of the invention are attained and although the invention has been described and illustrated in detail, it is to be clearly understood that the same is by way of illustration and example only and is not to be taken by way of limitation. The spirit and scope of this invention are to be limited only by the terms of the appended claims.

What is claimed is:

1. A method of fabricating a polysilicon fuse comprising:
   depositing a layer of polycrystalline silicon on a substrate to have a thickness of greater than 1200 Angstroms;
   oxidizing said polycrystalline layer to form a polycrystalline layer of a thickness below 1000 Angstroms with an oxide layer thereon;
   removing said oxide layer over a measurement area of said polycrystalline layer; and
   measuring the final thickness of said polycrystalline layer.

2. The method according to claim 1 including doping said polycrystalline layer with impurities prior to oxidizing.

3. The method according to claim 1 including patterning said polycrystalline layer to form individual fuse structures.

4. The method according to claim 3 wherein said patterning includes forming a mask on said polycrystalline layer, etching said polycrystalline layer using said mask and removing said mask layer.

5. The method according to claim 1 wherein said polycrystalline layer is deposited by low pressure chemical vapor deposition to a thickness of approximately 1800 Angstroms.

6. The method according to claim 5 wherein said polycrystalline layer is oxidized to form a polycrystalline layer having a thickness of approximately 50 Angstroms more than the desired thickness and removing said oxide layer over all fuse structures.

7. The method according to claim 5 wherein said polycrystalline layer is oxidized to form a polycrystalline layer having a thickness of approximately 750 Angstroms.

8. The method according to claim 1 wherein said polycrystalline layer is oxidized in a partially oxygen rich environment.

9. The method according to claim 8 wherein said environment is less than 50% oxygen rich.

* * * * *